(12) United States Patent
Wadhwa et al.

(10) Patent No.: US 7,525,353 B2
(45) Date of Patent: Apr. 28, 2009

(54) BROWN OUT DETECTOR

(75) Inventors: Sanjay Kumar Wadhwa, Saharanpur (IN); Siddhartha G.K., New Delhi (IN)

(73) Assignee: Freescale Semiconductor, Inc., Austin, TX (US)

( * ) Notice: Subject to any disclaimer, the term of this patent is extended or adjusted under 35 U.S.C. 154(b) by 185 days.

(21) Appl. No.: 11/855,153

(22) Filed: Sep. 14, 2007

(65) Prior Publication Data

US 2008/0018368 A1   Jan. 24, 2008

Related U.S. Application Data

(62) Division of application No. 11/487,641, filed on Jul. 17, 2006, now abandoned.

(51) Int. Cl.
*H03L 7/00*   (2006.01)

(52) U.S. Cl. .................. 327/143; 327/142; 327/198

(58) Field of Classification Search ................ None
See application file for complete search history.

(56) References Cited

U.S. PATENT DOCUMENTS

| | | | |
|---|---|---|---|
| 4,260,907 A | | 4/1981 | Winebarger |
| 4,591,745 A | * | 5/1986 | Shen .......................... 327/143 |
| 5,523,710 A | * | 6/1996 | Miyake et al. ............... 327/198 |
| 5,528,184 A | * | 6/1996 | Gola et al. ................... 327/198 |
| 5,606,511 A | | 2/1997 | Yach |
| 5,612,641 A | * | 3/1997 | Sali ............................. 327/143 |
| 5,703,510 A | * | 12/1997 | Iketani et al. ................ 327/143 |
| 5,831,460 A | | 11/1998 | Zhou |
| 5,859,768 A | | 1/1999 | Hall et al. |
| 5,917,255 A | * | 6/1999 | Ciccone ....................... 307/130 |
| 6,104,220 A | | 8/2000 | Ciccone |
| 6,515,523 B1 | | 2/2003 | Bikulcius |
| 6,972,988 B1 | * | 12/2005 | Lu et al. ...................... 365/158 |
| 7,057,427 B2 | | 6/2006 | Wadhwa et al. |
| 7,221,199 B2 | * | 5/2007 | Chung ......................... 327/143 |

* cited by examiner

*Primary Examiner*—Tuan T. Lam
*Assistant Examiner*—Hiep Nguyen
(74) *Attorney, Agent, or Firm*—Charles Bergere

(57) ABSTRACT

A brown out detector includes a first resistive element connected to a first voltage and a first node. A capacitor is connected to the first node and a second voltage. The detector also includes a second transistor and a third transistor. The second transistor has a drain connected to a second node, a source connected to the first node, and a gate connected to the first voltage. The third transistor has a source connected to the second voltage and the capacitor, a drain connected to the second node, and a gate connected to the first voltage. The detector also includes a latch having an input connected to the second node and a detector output, which generates a reset signal when the first voltage is less than a detection threshold voltage.

8 Claims, 5 Drawing Sheets

BROWN OUT DETECTOR

BACKGROUND OF THE INVENTION

The present invention relates generally to detecting and responding to brown out events in a semiconductor chip. More particularly, the present invention relates to a brown out detector circuit for resetting semiconductor chips during brown outs.

A brown out is a common condition in an electrical system of low supply voltage (VDD) that impacts correct system operation. Brown outs may be caused by a variety of ordinary glitches, including inadequate power regulation, powering up or down system components, and software bugs. Portable electronic devices, such as cellular phones and cameras are particularly susceptible to brown outs, because the tenuous connection between the device's battery and its terminal may be jarred by even slight movements.

During a brown out, if the VDD drops below the required voltage of the electrical system, data may be corrupted and the chip may malfunction. Because the condition of circuit elements is lost during the brown out, the chip must then be reset to resume operation. Therefore, accurate brown out detection and subsequent chip reset is vital to ensuring reliable operation in most electrical systems.

In general, a voltage level or brown out detection circuit, which is coupled to the chip, is used to prevent data corruption and chip malfunction. The detection circuit typically is used not only to detect when VDD falls below a minimum operating voltage, but also when it rises back to a stable operating voltage. When VDD falls below the minimum detection threshold voltage, the detection circuit generates a chip reset signal to set logic within the chip to a known state. Therefore, when VDD returns to a stable operating potential, the chip may resume operation from the reset state.

Because of the strong demand for portability, it has become increasingly important for electronic devices to minimize power use to conserve battery life. Unfortunately, typical voltage level detectors require a steady state current to operate, which in turn drains the battery. In addition, the low operating voltage levels of portable devices leave much less margin of error for the detectors to operate within.

Other power saving features of portable devices, such as sleep and hibernation modes, also present problems. Because the VDD changes dramatically when a portable device enters sleep mode and may resemble a brown out, the voltage detector must be able to differentiate between the two events. For example, if a system reset is triggered when the device hibernates, the chip may malfunction.

Accordingly, it would be desirable to have a brown out detector that consumes very little power and operates reliably in low voltage systems having power saving features.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE INVENTION

A method and an apparatus for providing brown out detection are provided. In the following description, numerous specific details are set forth in order to provide a thorough understanding of the present invention. It will be understood, however, to one skilled in the art, that the present invention may be practiced without some or all of these specific details. In other instances, well known process operations have not been described in detail to not unnecessarily obscure the present invention.

Figure 1:
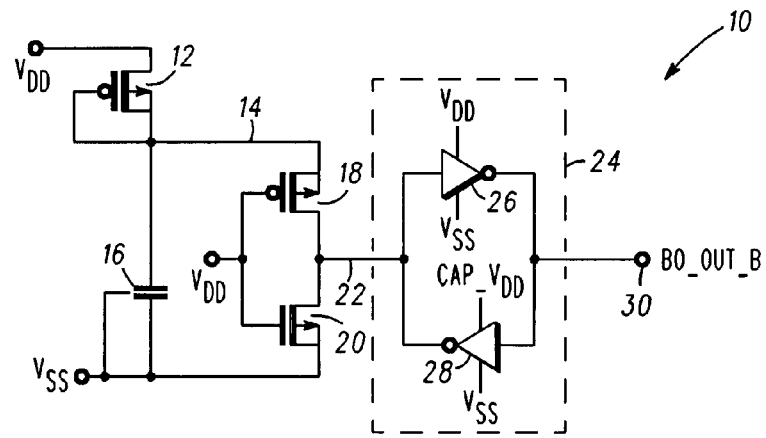
FIG. 1 is a schematic circuit diagram of a voltage level detector in accordance with an embodiment of the present invention.

Referring now to FIG. 1, a circuit diagram of a brown out or voltage level detector 10 in accordance with one embodiment of the present invention is shown. The voltage level detector 10 includes a first resistive element 12. In this embodiment, a transistor is used as first resistive element 12, but in other embodiments, a resistor may also be used. The resistor may be on-chip or off-chip. The first resistive element 12 (in this embodiment) has a source connected to a first voltage VDD, which is the supply voltage of a circuit or semiconductor chip. The first resistive element 12 also has a drain and a gate connected to a first node (cap_vdd) 14.

In this embodiment of the present invention, the first resistive element 12 may be a diode connected positive-channel metal oxide semiconductor (PMOS) transistor having a threshold voltage $V_{t1}$. In other embodiments, the first resistive element 12 may also be a diode connected negative-channel metal oxide semiconductor (NMOS) transistor. If a resistor is used instead of a transistor for the resistive element 12, it should have a resistor capacitor (RC) time constant greater than the slowest detectable ramp down rate during a brown out event.

The voltage level detector 10 also includes a capacitor 16, a second transistor 18, and a third transistor 20. The capacitor 16 is connected to the node cap_-vdd 14 and a second voltage VSS or ground. For example, the capacitor 16 may have a value of about 20 pF when VDD is about 1.2V. The second transistor 18 has a drain connected to a second node (latch_in) 22, a source connected to the first node cap_vdd 14, a gate connected to VDD, and a threshold voltage $V_{t2}$. The third transistor 20 has a source connected to VSS, a drain connected to the second node 22, and a gate connected to VDD.

In one embodiment of the present invention, the second transistor 18 may be a PMOS transistor and the third transistor 20 may be a NMOS transistor.

The voltage level detector 10 further includes a latch module 24, which is connected to the second node 22. The latch module 24 includes a first inverter 26 and a second inverter 28. The first inverter 26 has an input connected to the second node latch_in 22 and an output connected to a third node 30, which is also the output (bo_out_b) of the voltage level detector 10. The first inverter 26 is also connected to VDD and VSS. The second inverter 28 has an input connected to the third node bo_out_b 30 and an output connected to the second node 22. The second inverter 28 is also connected to the first node cap_vdd 14 and VSS. The third node bo_out_b 30 of the voltage level detector 10 may be connected to a reset switch of the semiconductor chip.

To detect brown out events in a semiconductor chip, the voltage level detector 10 is connected to the first voltage VDD, which is the supply voltage of the chip. During normal chip operation when VDD is ramped up to its full voltage, the first node cap_vdd 14 is charged to a minimum voltage equal to the supply voltage minus the threshold voltage (VDD-$V_{t1}$) of the first resistive element 12. Due to sub-threshold and diode leakage of the first resistive element 12, the first node cap_vdd 14 may rise to a maximum of VDD.

While supply voltage VDD is full, the third transistor 20 pulls down the voltage at the second node latch_in 22, causing the voltage level detector 10 to output VDD at the third node bo_out_b 30. Accordingly, during normal chip operation, all paths from VDD to VSS within the voltage level detector 10 are off. Because of this innovative design feature, the detector 10 does not consume any leakage current in this state. Therefore, in contrast with prior art circuits, when the voltage level detector 10 is not needed, it consumes no power, which is particularly advantageous when the chip is used in a portable device.

In one embodiment of the present invention, a brown out occurs when VDD drops from full by more than the threshold voltage $V_{t1}$ of the first resistive element 12 or equivalently, when VDD drops to less than the voltage at the first node cap_vdd 14. During the brown out, the first resistive element 12 enters cutoff mode and prevents reverse current from the first node cap_vdd 14 to VDD. At the same time, the capacitor 16 maintains the voltage of the first node cap_vdd 14 and prevents it from floating. If VDD drops below the voltage at the first node cap_vdd 14 by more than threshold voltage $V_{t2}$, the second transistor 18 is activated and pulls the voltage at the second node latch_in 22 towards the voltage at the first node cap_vdd 14. In one embodiment of the invention, the detection threshold voltage is less than between about 75% of the first voltage, when the first voltage is full. Because the drive strength of the third transistor 20 is less than the drive strength of the second transistor 18, current flow to VSS is reduced, enabling sufficient charging of the second node latch_in 22. In one embodiment of the present invention, the drive strength of the second transistor 18 is preferably set as high as possible, while the drive strength of the third transistor 20 is preferably set as low as possible.

During the brown out, the second inverter 28 may also aid in charging the second node latch_in 22 because it is connected to the first node cap_vdd 14 instead of VDD, which may not have adequate remaining charge due to the brown out. When this occurs, the voltage at the third node output bo_out_b 30 is pulled low by the latch module 24 to generate a reset signal, which may be received by a set/reset flip flop to reset the chip. The reset then ensures that all circuit element values are known so that the chip may resume operation when the brown out has ended.

Figure 2:
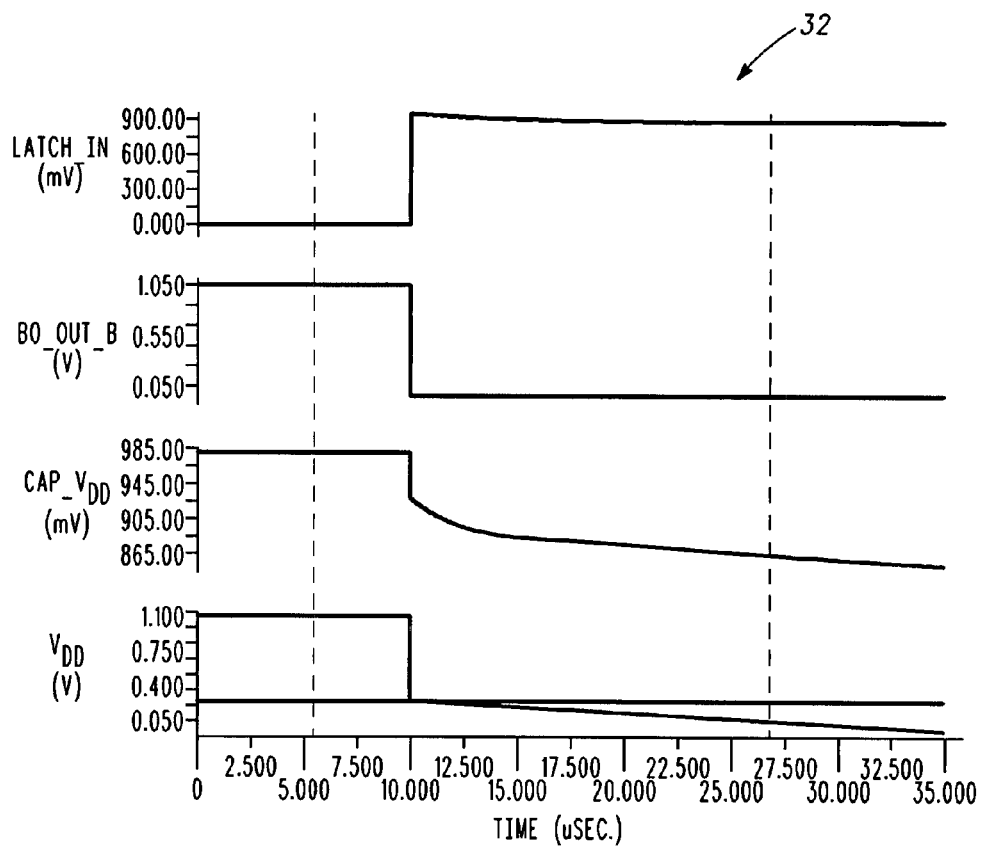
FIG. 2 is a graph illustrating various voltages versus time for a first ramp down rate of a voltage detector during a brown out in accordance with one embodiment of the invention.

FIG. 2 is a timing chart 32 illustrating various voltage values versus time for the brown out or voltage detector 10 during a brown out condition. The chart 32 tracks the voltages of VDD, the first node cap_vdd 14, second node latch_in 22, and third node bo_out_b 30. During normal operation, VDD is fully charged at 1.1V and the first node cap_vdd 14 is about 984 mV, while the second node latch_in 22 is low and the third node bo_out_b 30 is high. In a brown out, VDD ramps down from 1.1V to 0.3V in about 10 μs. Upon the detection of a brown out event, the voltage at the second node latch_in 22 goes high and the voltage at the third node bo_out_b 30 goes low, which resets the chip. Because of the capacitor 16, the voltage at the first node cap_vdd 14 discharges slowly, which allows the voltage detector 10 to respond to the brown out.

Figure 3:
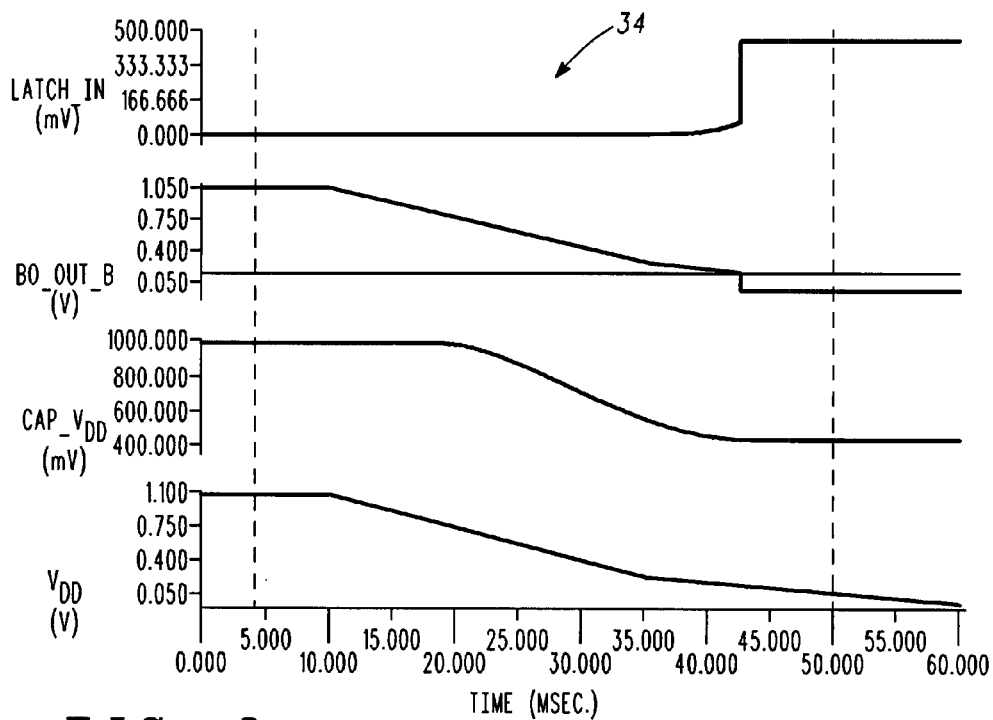
FIG. 3 is a graph illustrating various voltages versus time for a second ramp down rate of a voltage detector during a brown out in accordance with another embodiment of the present invention.

FIG. 3 is another timing chart 34 illustrating various voltage values over time of the voltage detector 10 during a brown out. In this example, as the timing chart 34 shows, the ramp down of VDD occurs over a much longer time period (25 ms) than in chart 32 (10 uS). At slower VDD ramp down rates, the detection threshold is reduced due to parasitic leakage. However, as shown in the chart 34, the voltage level detector 10 of the present invention is able to detect and respond to a broad range of VDD ramp down rates during brown outs.

Figure 4:
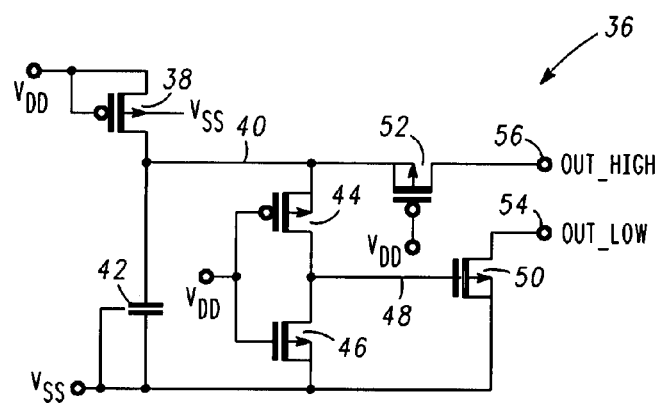
FIG. 4 is a schematic circuit diagram of a voltage level detector in accordance with an embodiment of the present invention.

Referring now to FIG. 4 a circuit diagram of a brown out or voltage level detector 36 in accordance with another embodiment of the present invention is shown. Though similar to the voltage level detector 10 in FIG. 1, in this particular embodiment, the voltage level detector 36 has been designed to connect to an existing power on reset (POR) circuit within the semiconductor chip. The voltage level detector 36 includes a first resistive element 38. The first resistive element 38 may be a resistor or a transistor. In the embodiment shown, the first resistive element 38 is a diode connected NMOS transistor having a drain and a gate connected to a first voltage VDD. The transistor 38 also has a source connected to a first node (cap_vdd) 40. In one embodiment, the first transistor 38 may be a diode connected PMOS transistor. A capacitor 42 is connected between the first node cap_vdd 40 and a second voltage VSS or ground.

The voltage level detector 36 also includes a second transistor 44 and a third transistor 46. The second transistor 44 has a drain connected to a second node (gate) 48, a source connected to the first node cap_vdd 40, and a gate connected to VDD. The third transistor 46 has a source connected to VSS, a drain connected to the second node (gate) 48, and a gate connected to VDD. In one embodiment of the present invention, the second transistor 44 may be a PMOS transistor and the third transistor 46 may be a NMOS transistor.

The voltage level detector 36 further includes a fourth transistor 50 and a fifth transistor 52. The fourth transistor 50 has a source connected to VSS and a gate connected to the second node (gate) 48. The fifth transistor 52 has a source connected to the first node cap_vdd 40 and a gate connected to VDD. The fourth transistor 50 and fifth transistor 52 also have drains connected to a low output (out_low) 54 and a high output (out_high) 56, respectively. The low and high outputs 54 and 56 may be connected to a POR circuit of the semiconductor chip.

In one embodiment of the present invention, the transistors of the voltage level detector 36 may have the following sizes. The first transistor 38 may have a width of about 0.3μ and length of about 1.5μ. The second transistor 44 may have width of about 0.12μ and length of about 0.15μ. The third transistor 46 may have width of about 1.0μ and length of about 0.01μ.

The fourth transistor 50 may have width of about 0.2μ and length of about 0.01μ. The fifth transistor 52 may have width of about 0.12μ and length of about 0.01μ. As will be understood by a person of skill in the art, the dimensions listed are exemplary and may vary depending on factors such as process technology, supply voltage, and required detection threshold.

During normal chip operation, the voltage at the first node cap_vdd 40 is less than or at most equal to VDD and second node (gate) 48 is pulled down by the third transistor 46, which turns off the fourth transistor 50 while the low output out_low 54 is floating. Similarly, because VDD is greater than the voltage at the first node cap_vdd 40, the fifth transistor 52 is also turned off while the high output out_high 56 is floating. Because the low output out_low 54 and the high output out_high 56 are floating, these outputs may be connected to any of the nodes in the POR circuit without drawing any current. Thus, the voltage level detector 36 consumes very little power. In addition, because the voltage detector 36 does not affect the POR threshold voltage setting, both the POR and voltage detector thresholds can be independently configured and controlled.

During a brown out, when VDD drops to less than the voltage at the first node cap_vdd 40, the first transistor 38 prevents reverse current from the first node cap_vdd 40 to VDD. The voltage at the first node cap_vdd 40 is maintained by the capacitor 42. If VDD drops below the voltage at the first node cap_vdd 40 by more than the threshold voltage $V_{t2}$ of the second transistor 44, then the second transistor 44 is activated to pull the voltage at the second node (gate) 48 towards the voltage at the first node cap_vdd 40. Additionally, the third transistor 46 is kept very weak to reduce current flow to VSS and to enable sufficient charging of the second node (gate) 48. As the voltage at the second node (gate) 48 is pulled towards the voltage at the first node cap_vdd 40, the low output out_low 54 is pulled low and the high output out_high 56 is pulled high to generate a pair of reset signals to the POR circuit in the chip.

Figure 5:
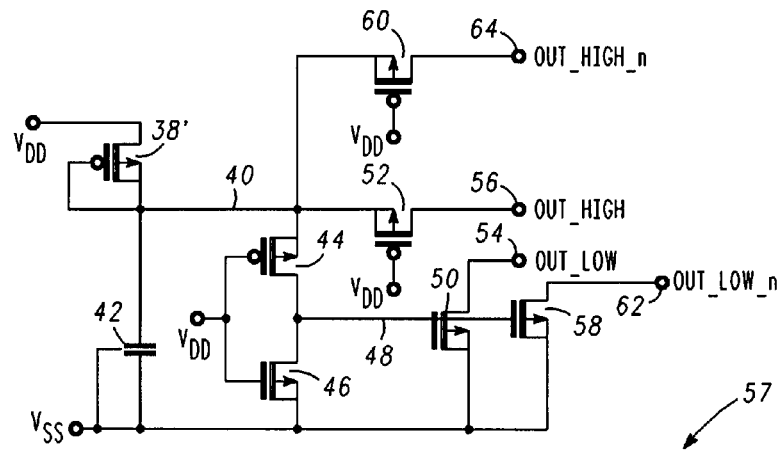
FIG. 5 is a schematic circuit diagram of a voltage level detector having additional output nodes in accordance with one embodiment of the present invention.

FIG. 5 is a circuit diagram of a brown out or voltage level detector 57 having additional output nodes in accordance with one embodiment of the present invention. The voltage level detector 57 is similar to the voltage level 36 described in FIG. 4 except that a first transistor 38' has its gate connected to its drain. To support additional output nodes, the voltage level detector 57 also includes a sixth transistor 58 and a seventh transistor 60. The sixth transistor 58 has a source connected to VSS and a gate connected to the second node gate 48. The seventh transistor 60 has a source connected to the first node cap_vdd 40 and a gate connected to VDD. The sixth transistor 58 and seventh transistor 60 also have drains connected to a low output (out_low_n) 62 and a high output (out_high_n) 64, respectively.

These additional outputs 62 and 64 may be connected to a POR circuit of the semiconductor chip. If the POR circuit requires additional brown out signals from the voltage detector 57, additional transistors may be added to the voltage detector 57 and used to generate the desired signals. However, if extra transistors are used, the value of the capacitor 42 must be high enough to support the extra outputs.

Figure 7:
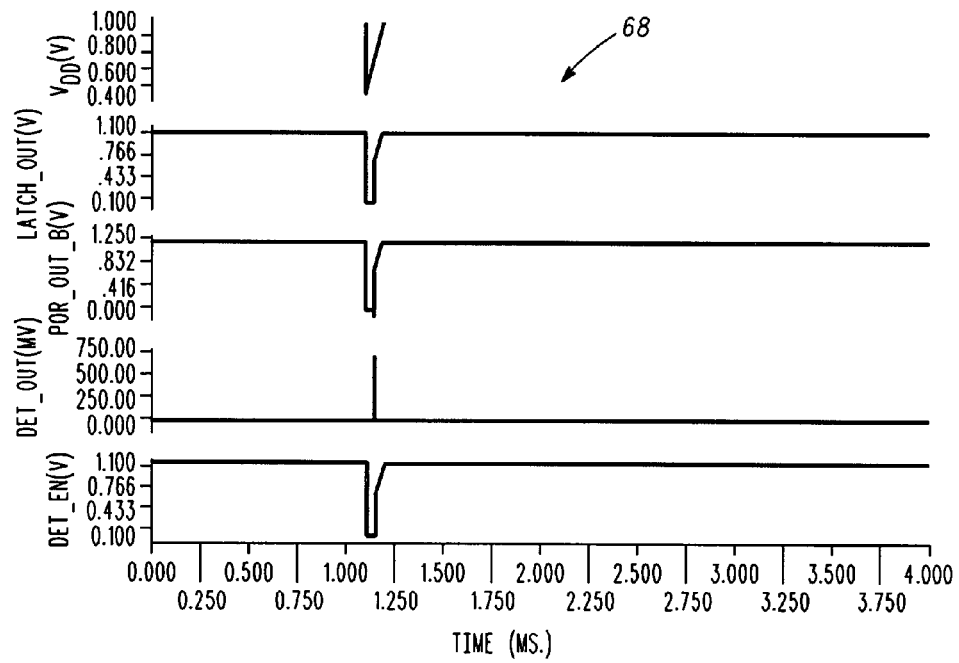
FIG. 7 is a graph of voltage versus time for a POR circuit during a brown out in accordance with an embodiment of the invention.
Figure 6:
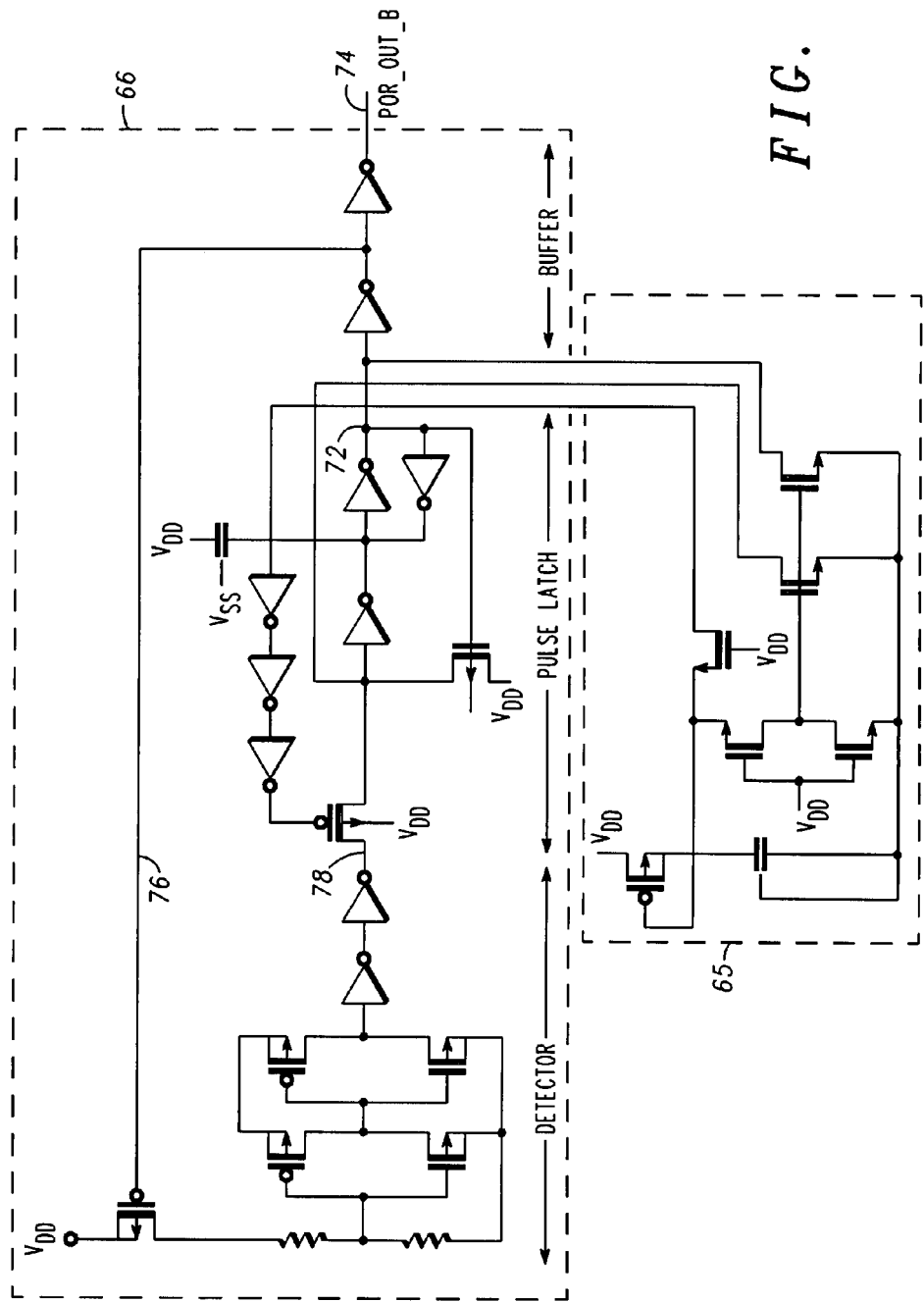
FIG. 6 is a schematic circuit diagram of a voltage detector connected to a point of reset circuit in accordance with an embodiment of the present invention.
Figure 8:
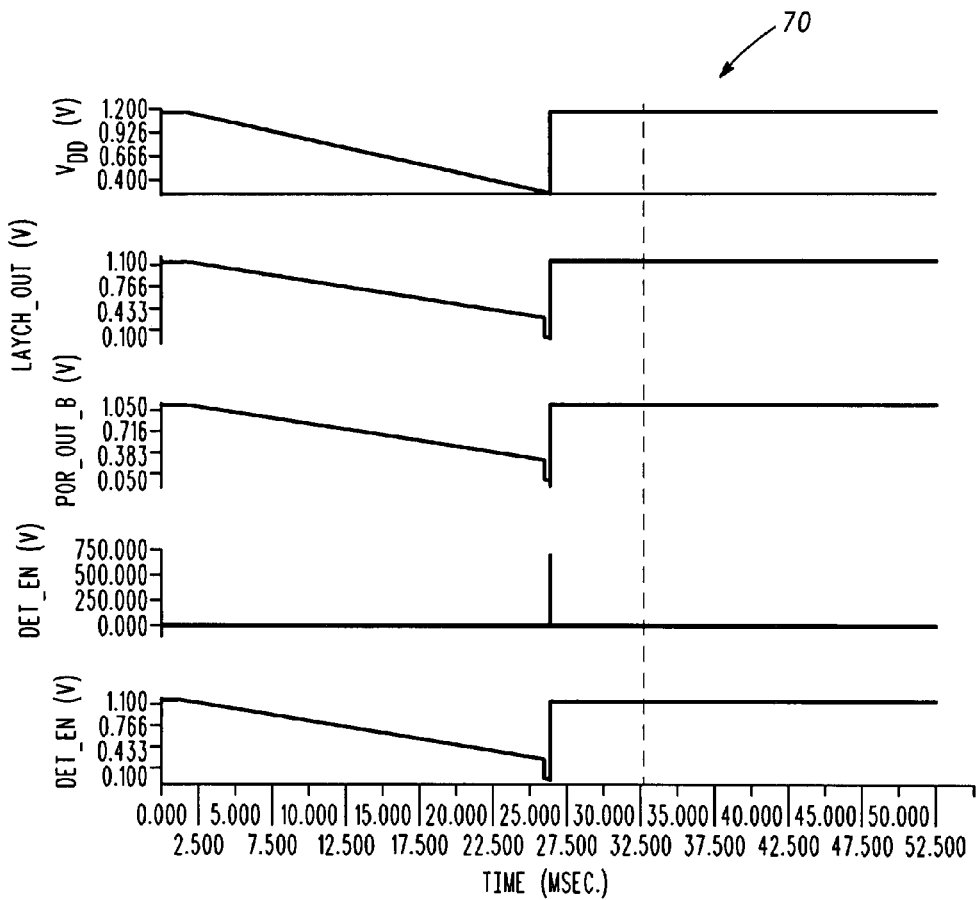
FIG. 8 is a graph of voltage versus time for a POR circuit during a brown out in accordance with another embodiment of the invention.

FIG. 6 illustrates a brown out or voltage level detector 65 connected to a typical POR circuit 66 in accordance with one embodiment of the present invention. FIGS. 7 and 8 are timing diagrams 68 and 70 illustrating various voltages of the POR circuit 66 during a brown out in accordance with one embodiment of the invention. The timing diagram 68 tracks the voltages of VDD, latch output (latch_out) 72, POR circuit output (por_out_b) 74, detector enable node (det_en) 76, and detector output node (det_out) 78 during a brown out having a VDD ramp down rate of 1 μs. The timing diagram 70 tracks the same voltages during a brown out having a VDD ramp down rate of 25 ms.

In both cases, when the chip is first powered up, the voltage at det_out 78 remains low. As VDD ramps up to its normal voltage, it will cross a de-assertion voltage, which is the voltage at which the circuit recognizes that it may be safely operated. When it crosses the de-assertion voltage, the voltages at det_out 78, and subsequently at latch_out 72 and por_out_b 74 go high to switch the state of the reset signal and enable normal operation. With the connections as shown in FIG. 6, when a brown out occurs, the voltage detector 65 pulls down the voltage at latch_out 72, resulting in the voltage at por_out_b 74 going low. When the voltage at por_out_b 74 is low, the chip is reset by the POR circuit 66 to avoid malfunctioning. When supply ramps up after the brown out event, the POR circuit 66 output switches state after the supply passes the de-assertion voltage to prepare the chip to resume operation from a known state.

Figure 9:
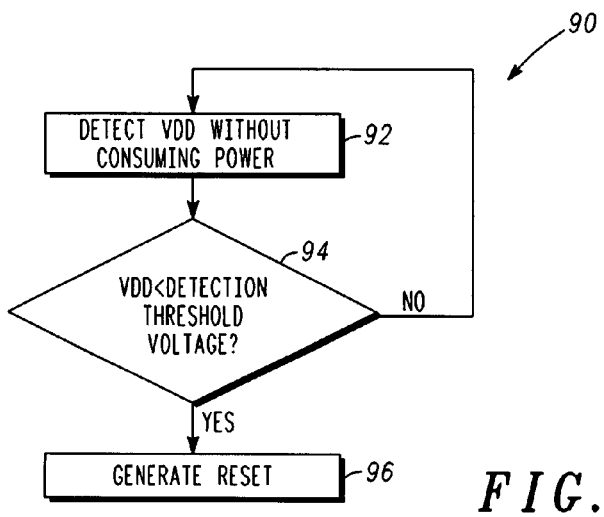
FIG. 9 is a flow chart of a method for generating a reset signal during a brown out in accordance with an embodiment of the present invention.

FIG. 9 is a flow chart of a method 90 for generating a reset signal during a brown out in accordance with one embodiment of the present invention. The method 90 begins when a first voltage (VDD) is detected at step 92. To prevent the consumption of any power during normal operation, VDD is not connected to ground (VSS). At step 94, it is determined whether the first voltage has dropped below a detection threshold voltage. In one embodiment of the invention, the detection threshold is less than about 75% of the first voltage when the first voltage is full. If the first voltage is above the detection threshold voltage, then the method 90 returns to step 92 and continues to detect VDD. If the first voltage has dropped to less than the detection threshold voltage, this indicates that a brown out is occurring and a reset signal to reset the semiconductor chip is generated at step 96. In one embodiment of the invention, the first voltage is about 1.2V when the first voltage is full and the detection threshold voltage less than about 0.9V. During Dynamic Voltage Frequency Scaling (DVFS), the first voltage is about 1.4V.

One advantage of the present invention is that it does not consume any current when supply voltage levels of the electronic device are at normal levels. This power saving feature is particularly important in portable devices that are dependent on limited battery life. Another advantage of the present invention is that it is adapted to work with devices that use applications, such as DVFS and Deep Sleep Mode (DSM), both of which may dramatically alter VDD during normal operation. More specifically, the present invention is able to differentiate between these applications, which intentionally change the voltage of the device, and actual brown outs to avoid accidentally resetting the device. For example, if the supply voltage of a device is 1.2V, then VDD may rise to 1.4V during DVFS and drop to 0.9V during DSM.

Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

The invention claimed is:

1. A brown out detector, comprising:
   a first resistive element connected to a first voltage and a first node;
   a capacitor connected to the first node and a second voltage;

a second transistor having a drain connected to a second node, a source connected to the first node, and a gate connected to the first voltage;

a third transistor having a source connected to the second voltage, a drain connected to the second node, and a gate connected to the first voltage;

a fourth transistor having a source connected to the second voltage, a drain connected to a first detector output, and a gate connected to the second node; and a fifth transistor having a drain connected to a second detector output, a source connected to the first node, and a gate connected to the first voltage, wherein the first detector output and the second detector output generate a reset signal when the first voltage is less than a detection threshold voltage.

2. The brown out detector of claim 1, wherein the first resistive element is a first transistor having a source connected to the first voltage.

3. The brown out detector of claim 2, wherein the first voltage is not connected to the second voltage when the first voltage is greater than the detection threshold voltage.

4. The brown out of claim 2, wherein the first transistor has a gate connected to the first voltage and a drain connected to the first node.

5. The brown out detector of claim 2, wherein the first transistor has a gate connected to the first node and a drain connected to the first node.

6. The brown out detector of claim 2, further comprising a sixth transistor having a source connected to the second voltage, a drain connected to a fourth detector output, and a gate connected to the second node.

7. The brown out detector of claim 6, further comprising a seventh transistor having a drain connected to a third detector output, a source connected to the first node, and a gate connected to the first voltage.

8. The brown out detector of claim 2, wherein the detection threshold voltage is less than about 75% of the first voltage when the first voltage is full.

* * * * *